(12) United States Patent
Kim

(10) Patent No.: US 11,495,291 B2
(45) Date of Patent: Nov. 8, 2022

(54) NON-VOLATILE MEMORY DEVICE AND OPERATING METHOD

(71) Applicant: SAMSUNG ELECTRONICS CO., LTD., Suwon-si (KR)

(72) Inventor: Seungbum Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/109,410

(22) Filed: Dec. 2, 2020

(65) Prior Publication Data

US 2021/0366539 A1    Nov. 25, 2021

(30) Foreign Application Priority Data

May 20, 2020    (KR) .................. 10-2020-0060623

(51) Int. Cl.
| | | |
|---|---|---|
| G11C 16/26 | (2006.01) | |
| G11C 11/56 | (2006.01) | |
| G11C 16/04 | (2006.01) | |
| H01L 25/18 | (2006.01) | |
| H01L 23/00 | (2006.01) | |
| H01L 25/065 | (2006.01) | |

(52) U.S. Cl.
CPC ...... *G11C 11/5642* (2013.01); *G11C 11/5671* (2013.01); *G11C 16/0483* (2013.01); *G11C 16/26* (2013.01); *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ............ G11C 11/5642; G11C 11/5671; G11C 16/0483; G11C 16/26; G11C 29/021; G11C 29/028; H01L 24/08; H01L 25/0657; H01L 25/18; H01L 2224/08145; H01L 2924/1431; H01L 2924/14511
See application file for complete search history.

(56) References Cited

U.S. PATENT DOCUMENTS

| | | |
|---|---|---|
| 9,190,159 B2 | 11/2015 | Kurosawa |
| 9,336,891 B2 | 5/2016 | Yuan et al. |
| 9,639,462 B2 | 5/2017 | Camp et al. |
| 9,728,263 B2 | 8/2017 | Sharon et al. |
| 9,905,302 B2 | 2/2018 | Karakulak et al. |
| 10,001,937 B2 | 6/2018 | Jung et al. |
| 10,360,986 B1 | 7/2019 | Hsiao et al. |
| 10,529,433 B1 | 1/2020 | Liikanen et al. |
| 2012/0134208 A1* | 5/2012 | Lee .................. G11C 16/0483 365/185.18 |

(Continued)

*Primary Examiner* — Xiaochun L Chen
(74) *Attorney, Agent, or Firm* — Volentine, Whitt & Francos, PLLC

(57) ABSTRACT

An operating method for a non-volatile memory device includes; performing a read operation on adjacent memory cells connected to an adjacent word line proximate to a target word line to determine adjacent data, classifying target memory cells connected to the target word line into groups according to the adjacent data, setting a read voltage level for each of the groups by searching for a read voltage level for target memory cells in at least one of the groups, and performing a read operation on target memory cells using the read voltage level set for each of the groups.

18 Claims, 17 Drawing Sheets

(56) References Cited

U.S. PATENT DOCUMENTS

| | | | |
|---|---|---|---|
| 2013/0064013 A1* | 3/2013 | Lee | G11C 16/10 365/185.03 |
| 2019/0172542 A1* | 6/2019 | Miladinovic | G06F 11/0727 |
| 2019/0362796 A1 | 7/2019 | Choi et al. | |
| 2020/0027503 A1 | 1/2020 | Chen et al. | |

* cited by examiner

NON-VOLATILE MEMORY DEVICE AND OPERATING METHOD

CROSS-REFERENCE TO RELATED APPLICATION

This application claims the benefit of Korean Patent Application No. 10-2020-0060623, filed on May 20, 2020 in the Korean Intellectual Property Office, the subject matter of which is hereby incorporated by reference.

BACKGROUND

The inventive concept relates to memory devices, and more particularly, to non-volatile memory devices and operating methods for non-volatile memory devices.

Memory devices are used to store data, and may be generally classified as volatile memory devices and non-volatile memory devices. So-called flash memory devices are one type of non-volatile memory commonly used in mobile phones, digital cameras, personal digital assistants (PDAs), mobile computing devices, personal computers, etc.

SUMMARY

Embodiments of the inventive concept provide memory devices, memory systems and/or methods of operating same that exhibit improved reliability and better overall read performance.

According to an aspect of the inventive concept, there is provided an operating method for a non-volatile memory device including; performing a read operation on adjacent memory cells connected to an adjacent word line proximate to a target word line to determine adjacent data, classifying target memory cells connected to the target word line into groups according to the adjacent data, setting a read voltage level for each of the groups by searching for a read voltage level for target memory cells in at least one of the groups, and performing a read operation on target memory cells using the read voltage level set for each of the groups.

According to an aspect of the inventive concept, there is provided a non-volatile memory device comprising; a memory cell array including memory cells respectively connected to bit lines and word lines, and control logic configured to perform a read operation on the memory cells connected to a target word line among the word lines and an adjacent word line proximate to the target word line. The control logic sets a read voltage level for each one of a plurality of groups by classifying target memory cells connected to the target word line into the plurality of groups according to adjacent data read form adjacent memory cells connected to the adjacent word line, searches for a read voltage level for target memory cells included in at least one group among the plurality of groups, and performs the read operation directed to the target memory cells using the read voltage level set for a group to which the target memory cells belong.

According to an aspect of the inventive concept, there is provided a non-volatile memory system including; a memory cell array including memory cells respectively connected to bit lines and word lines, and control logic configured to perform a read operation directed to target memory cells connected to a target word line among the word lines and adjacent memory cells storing adjacent data and connected to an adjacent word line proximate the target word line, set a read voltage level for each group among a plurality of groups by classifying target memory cells into one of the plurality of groups according to the adjacent data, search for a read voltage level for target memory cells included in at least one group among the plurality of groups, and perform the read operation directed to the target memory cells using the read voltage level set for each group to which the target memory cells belong.

BRIEF DESCRIPTION OF THE DRAWINGS

Certain embodiments of the inventive concept will be described hereafter with reference to the accompanying drawings in which.

DETAILED DESCRIPTION

Figure 1:
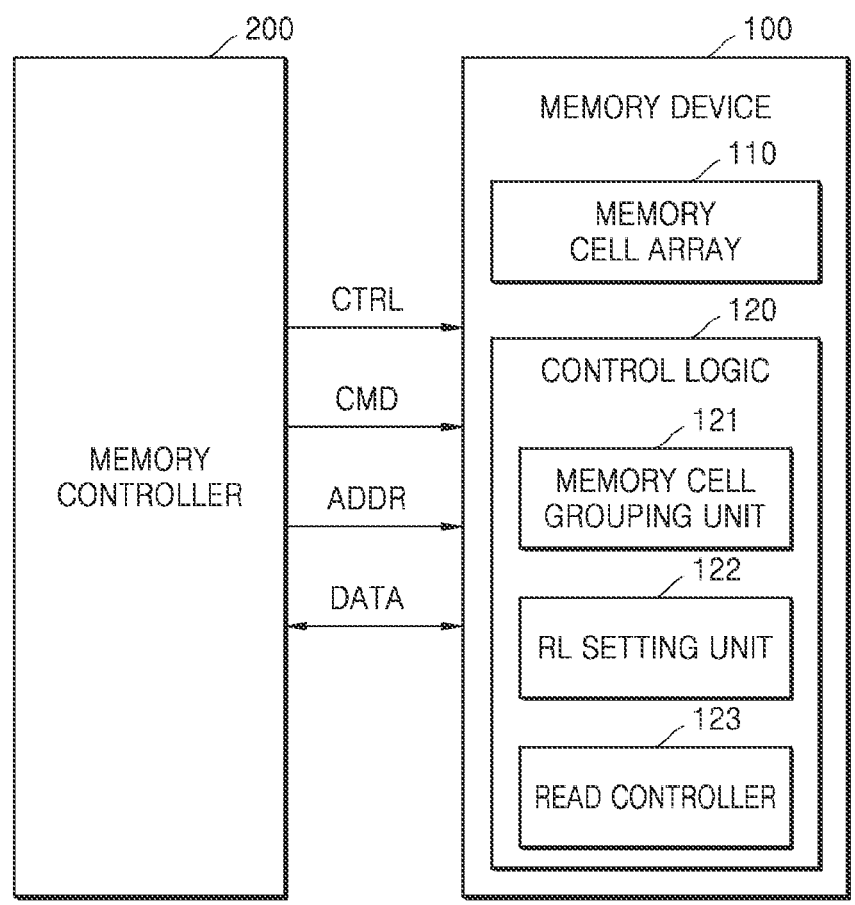
FIG. 1 is a block diagram illustrating a memory system according to embodiments of the inventive concept.

Figure (FIG. 1 is a block diagram of a memory system according to embodiments of the inventive concept. Here, the memory system may generally include a memory device 100 and a memory controller 200. The memory device 100 may include a memory cell array 110 and a control logic 120.

The memory controller 200 may control read, program, and erase operations, among other operations, performed by the memory device 100. In this regard, the memory controller 200 may variously provide data (DATA), address signal(s) (ADDR), command signal(s) (CMD) and/or control signal(s) (CTRL) to the memory device 100 in order to read data stored in the memory device 100, program (or write) data to the memory device 100, and erase data stored in the memory device 100. For example, data may be read from the memory device 100 during a read operation controlled by the memory controller 200 and performed in response to a read request received from an external host (not shown). In similar manner, data may be written to the memory device 100 in response to a write request received from the host. During the read operations and write operations performed by the memory system of FIG. 1, data (e.g., read data retrieved from the memory device 100 during a read operation and/or write data to be written to the memory device 100) may be exchanged between the memory controller 200 and the memory device 100.

The memory cell array 110 may include a plurality of memory cells. Hereafter, embodiments in which the memory cell array 110 includes a plurality of NAND flash memory cells will be assumed. However, other embodiments of the inventive concept may additionally or alternately incorporate one or more other types of memory cells, such as resistive random access memory (RAM) (RRAM), phase-change RAM (PRAM) and/or magneto-resistive RAM (MRAM).

The control logic 120 may control the execution (or performance) of read operations directed to memory cells connected to a word line corresponding to a read address. The read operations may variously use one or more read voltage level(s) during a read period to determine the programmed state (i.e., the data value) for the memory cells being read. Thus, a read voltage level may be a default read voltage level defined (e.g.,) during a packaging process for the memory device 100. Here, the default read voltage level may be determined based on an initial (or modeled) distribution of threshold voltages for the memory cells.

In some embodiments, the control logic 120 may read data in relation to (or based on) the default read voltage level, and thereafter, perform an error correction operation on the resulting read data. For example, the control logic 120 may perform an error checking and correcting (ECC) encoding process and a corresponding ECC decoding process using an algorithm such as a Reed Solomon (RS) code, a Hamming code, and a cyclic redundancy code (CRC).

In some embodiments, the ECC encoding process may include an operation that generates a parity bit corresponding to write data to be programmed to memory cells of the memory device 100 during a program operation. Thereafter, the corresponding ECC decoding process may be used to detect and/or correct (hereafter, "detect/correct") bit error(s) (hereafter, "error") in read data retrieved from the memory cell array 110 during a read operation. In this regard, the control logic 120 may detect/correct the error by comparing one or more parity bit(s) (hereafter, "parity") generated and stored when write data was programmed to the memory device 100 with parity generated when the read data was retrieved from the memory device 100. This comparison operation may involve one or more logic operation(s) (e.g., an exclusive OR (XOR) operation) that are performed to detect the error.

In the illustrated example of FIG. 1, the control logic 120 includes a memory cell grouping unit 121, a read level (RL) setting unit 122 and a read controller 123, These various units may be variously implemented using software, hardware and/or firmware and may be flexibly differentiated in operation according to function(s). For example, each of the foregoing units may be functionally classified (or differentiated), yet provided using a single processor packaging, or multiple, separate processor packaging. Exemplary functions (e.g., operations) for the memory cell grouping unit 121, the RL setting unit 122 and the read controller 123 of the control logic 120 described in relation to FIG. 1 will be described hereafter in some additional detail with reference to FIGS. 6, 7, 8, 9, 10, 11 and 12.

Figure 2:
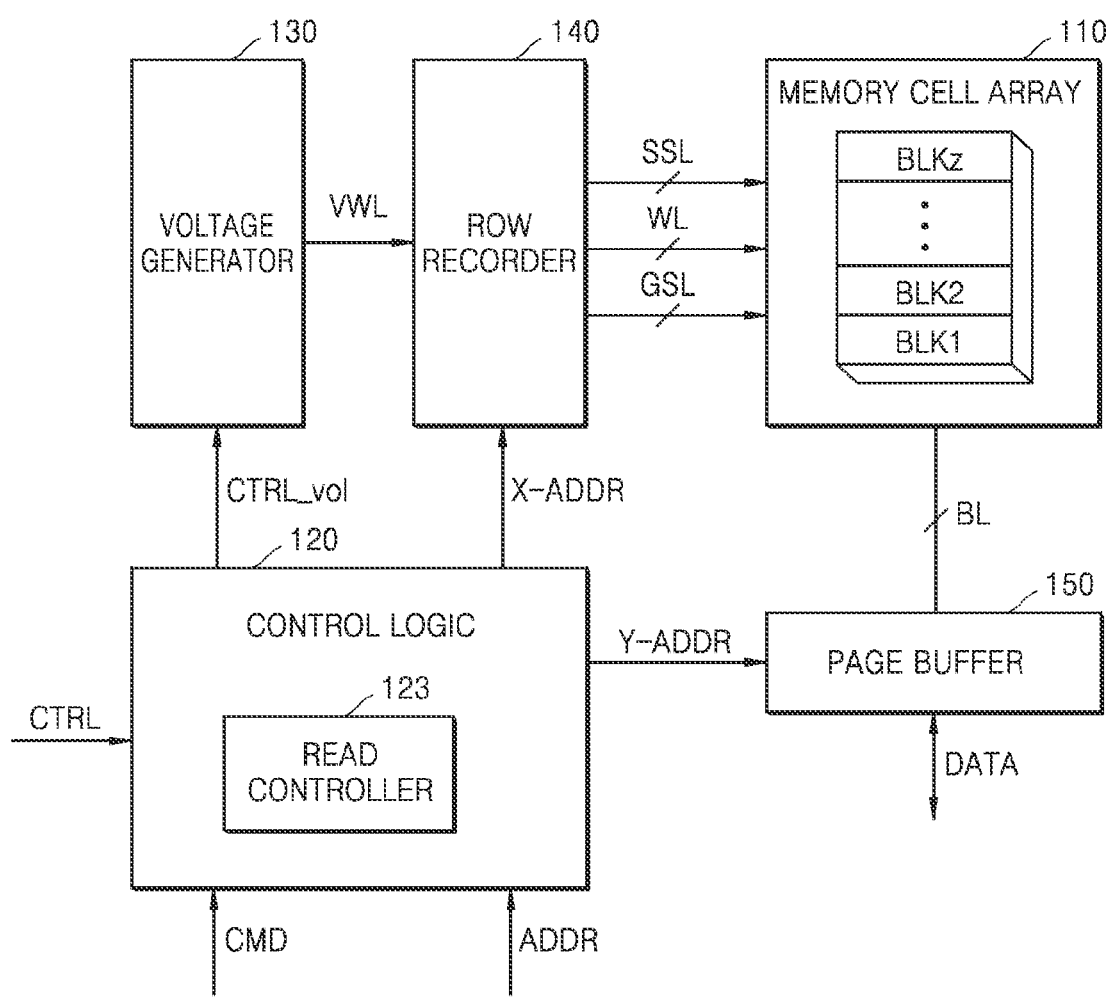
FIG. 2 is a block diagram further illustrating in one example the memory device 100 of FIG. 1.

FIG. 2 is a block diagram further illustrating in one example the memory device 100 of FIG. 1.

Referring to FIG. 2, the memory device 100 may include the memory cell array 110, the control logic 120, a voltage generator 130, a row decoder 140 and a page buffer 150. Examples of the memory cell array 110 and the control logic 120 have been described in the context of FIG. 1. However, the memory device 100 is not limited to only the descriptions provided in relation to FIGS. 1 and 2, and other embodiments of the inventive concept may include different or additional components, such as data input/output (I/O) unit(s).

Referring to FIG. 2, the memory cell array 110 may include memory cells respectively connected by word lines WL and bit lines BL. The memory cell array 110 may be connected to the row decoder 140 via the word lines WL, string select lines SSL, and ground select lines GSL, and may be connected to the page buffer 150 via the bit lines BL. Each memory cell may store one or more bits, and each memory cell may be used as a single-level cell, a multi-level cell, or a triple-level cell.

The control logic 120 may provide various control signals required to write data to the memory cell array 110, read data from the memory cell 110, or erase data stored in the memory cell array 110 in response to a command CMD, address ADDR and/or control signal CTRL received from the memory controller 200. In this manner, the control logic 120 may control the execution of various operations in the memory device 100.

The various control signals provided by the control logic 120 may be respectively and selectively provided using the voltage generator 130, the row decoder 140 and/or the page buffer 150. For example, the control logic 120 may provide a voltage control signal CTRL_vol to the voltage generator 130, a row address X-ADDR to the row decoder 140, and a column address Y-ADDR to the page buffer 150. However, the scope of the inventive concept is not limited thereto, and the control logic 120 may further provide other control signals to the voltage generator 130, the row decoder 140 and the page buffer 150.

However, in the illustrated example of FIG. 2 the control logic 120 includes a read controller 123. During the read operation, the read controller 123 may control the voltage generator 130 and the row decoder 140, such that a read voltage having a read voltage level corresponding to a default level is applied to the selected word line WL. In addition, the read controller 123 may control the voltage generator 130 and the row decoder 140 to apply an optimum read voltage level to the selected memory cells should a read operation fail. In this context, the term "optimum" should be understood as a relative term denoting a best possible read voltage level under a defined set of circumstances.

The voltage generator 130 may generate various voltages used during the performing of program, read, and erase operations in the memory cell array 110 in response to the voltage control signal CTRL_vol provided by the control logic 120. The voltage generator 130 may generate a word line driving voltage VWL for driving the word lines WL, for example, a program voltage (or a write voltage), a read voltage, a program inhibit voltage, a read inhibit voltage, an erase verification voltage, or a program verification voltage. In addition, the voltage generator 130 may further generate a string select line driving voltage for driving the string select lines SSL and a ground select line driving voltage for driving the ground select lines GSL. In addition, the voltage generator 130 may further generate the erase voltage to be provided to the memory cell array 110.

The row decoder 140 may select some of the word lines WL in response to the row address X-ADDR received from the control logic 120. During the read operation, the row decoder 140 may apply the read voltage to the selected word line WL, and the read inhibit voltage to an unselected word line WL. In addition, during the program operation, the row decoder 140 may apply the program voltage to the selected word line WL, and the read inhibit voltage to the unselected word line WL. In addition, the row decoder 140 may select some of the string select lines SSL among the string select lines SSL or some of the ground select lines GSL among the ground select lines GSL, in response to the row address X-ADDR received from the control logic 120.

The page buffer 150 may be connected to the memory cell array 110 via the bit lines BL, and may select some of the bit lines BL in response to the column address Y-ADDR received from the control logic 120. During the read operation, the page buffer 150 may operate as a sense amplifier and sense "read data" stored in the memory cell array 110. However, during the program operation, the page buffer 150 may operate as a write driver enabling "write data" to be programmed (or stored) in the memory cell array 110.

In some embodiments, the page buffer 150 may include at least one latch including a forcing latch, wherein read data retrieved (e.g., sensed) from "target memory cells" (e.g., memory cells identified by a read request and/or a received address ADDR) may be temporarily stored in the at least one latch. Accordingly, the control logic 120 and/or the memory controller 200 may variously obtain read data including "adjacent data" stored in "adjacent memory cells") (e.g., memory cells physically proximate to the target memory cells), together with "target data" stored in the target memory cells from the page buffer 150. In this context, read data may be classified or grouped according to target data and adjacent data, respectively obtained from target memory cells and adjacent memory cells.

FIGS. 3, 4, 5, 6 and 7 (hereafter, "FIGS. 3 through 7," inclusively) are respective, conceptual diagrams graphically illustrating aspects of exemplary threshold voltage distributions for memory cells that may be used in certain embodiments of the inventive concept. In the illustrated examples of FIGS. 3 through 7, three-bit (or tri-level) memory cells are assumed that may have an erase state (E) or one of seven (7) possible programmed states (e.g., P1, P2, P3, P4, P5, P6, and P7). In FIGS. 3 through 7, the horizontal axis denotes threshold voltage level (Vth) and the vertical axis denotes a number of memory cells.

Figure 3:
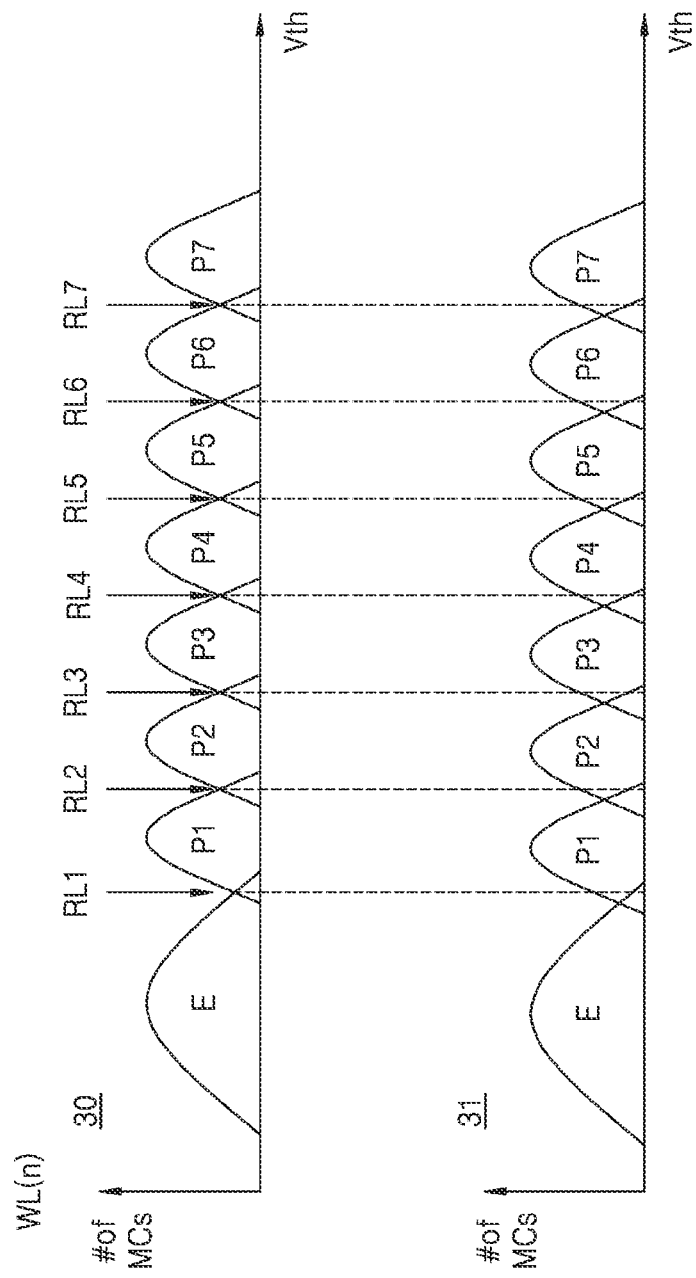
FIGS. 3, 4, 5, 6 and 7 are respective conceptual diagrams graphically illustrating aspects of exemplary threshold voltage distributions for memory cells that may be used in certain embodiments of the inventive concept.

Referring to FIGS. 1, 2 and 3, an initial distribution 30 of threshold voltages for memory cells MC connected to the word line WL may be inadvertently changed into a changed distribution 31 as the result of various factors, including (e.g.,) memory cell leakage due to lengthy data storage latencies, memory cell wear, read disturb (or read interrupt) effects, varying temperature, power and/or process conditions, etc.

The initial distribution 30 may be a distribution of the memory cells immediately following the programming of the memory cells, or a distribution within a certain period of time following the programming Here, the control logic 120 may determine first through seventh default read voltage levels (e.g., RL1 through RL7) for each of first through seventh program states (P1 through P7), based on a valley between two adjacent program states. For example, the control logic 120 may determine the first default read voltage level RL1 according to a detected valley between the erase state E and the first program state P1; and so on, until the control logic 120 determines the seventh default read voltage level RL7 according to a detected valley between the sixth program state P6 and the seventh program state P7.

The changed distribution 31 may be the distribution of the memory cells after a certain period of time has elapsed following the programming of the memory cells. As a result, memory cells respectively programmed to the erase state E, and the first through seventh program states P1 through P7 may have migrated (or "spread") to result in the changed distribution 31.

For example, a "data retention time" for data stored in a memory cell MC may be a time (often measured in relation to a particular temperature) following the last program operation directed to the memory cell. As the data retention time increases, electrical charge loss by the memory cell may increase, and the rate of charge loss may vary from word line WL to word line WL. Electrons trapped in the charge storage layer during the program operation may be lost over time due to various phenomena, such as a rearrangement phenomenon example, loss via a channel region, movement through the charge storage layer, etc. Accordingly, the threshold voltage Vth of the memory cells may decrease, and as a result, drooping and spreading may occur in the distribution according to the threshold voltage Vth of the memory cells MC. Further in this regard, a decrease in threshold voltage Vth may vary from word line WL to word line WL.

The read interrupt referred to above is a phenomenon in which a distribution of adjacent memory cells connected to an adjacent word line WL is inadvertently changed according to a read result directed to target memory cells connected to a target (or selected) word line WL. For example, when a program state corresponding to a high threshold voltage Vth is written to the memory cells connected to the selected word line WL, the threshold voltages Vth of the memory cells connected to the adjacent word line WL may increase, and an increase amount of the threshold voltage Vth may be different for each word line WL according to a distance from the memory cell to the selected word line WL.

Further, the threshold voltages Vth of the memory cells respectively programmed to the erase state E and the first program state P1 may decrease, and accordingly, the valley between the erase state E and the first program state P1 may be shifted in the negative direction. Accordingly, when the read operation is performed using the first default read voltage level RL1, the read error may occur in some of the memory cells programmed to the first program state P1. In this case, the read error may correspond to a case in which the number of fail bits among the read data is greater than or equal to a reference number of fail bits correctable by an ECC operation supported by the memory system. In this case, the read error may be eliminated by changing the optimum read voltage for the first program state P1 to a first corrected read voltage level corresponding to a shifted valley between the erase state E and the first program state P1.

Although the read error has been described according to the initial distribution 30 and the changed distribution 31 and in the context of the same word line WL, an increased retention time may require that adjacent data be read from adjacent memory cells using one or more (potentially different) read voltage levels from word lines WL in different chips or blocks in order to account for differences in temperature, voltage and/or process. However, the read error may occur even when the memory cells from different chips or blocks are read using a predetermined default read voltage level.

Figure 4:
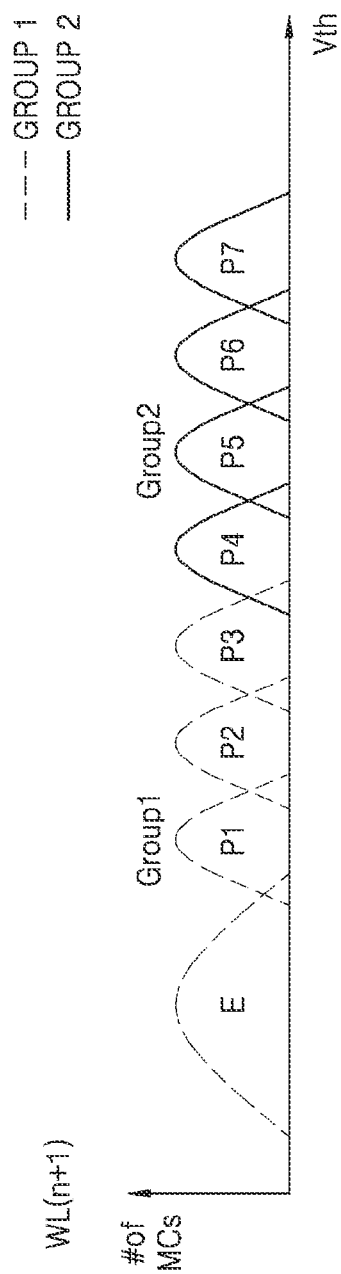

Referring to FIG. 4, the control logic 120 may load a read result from an adjacent word line WL(n+1)—which is here assumed to be a word lines WL adjacent to a target word line WL(n)—in response to a read voltage level reset instruction. Thus, the control logic 120 may re-read adjacent data from the adjacent memory cells connected to the adjacent word line WL(n+1) in response to the read voltage level reset instruction, but the inventive concept is not limited thereto.

In this manner, the control logic 120 may effectively "reset" the read voltage of the target word line WL(n) upon consideration of the adjacent data read from the adjacent memory cells. Here the adjacent data may have been previously stored in the page buffer. That is, a competent page buffer may include multiple latches (exceeding the number of target data bits) capable of temporarily storing data read from memory cells connected to one or more bit line(s) BL. Hence, and some adjacent data read from adjacent memory cell(s) may be stored in at least one of the page buffer latches.

In some embodiments, a read operation result for the adjacent memory cells may be classified according to the erase state E and each one of the first through seventh program states P1 through P7 according to one or more read voltage level(s). The control logic 120 may also classify the target data obtained from the target memory cells into groups—based on a voltage distribution indicating the read results from the adjacent memory cells—and classify the target memory cells into groups according to read interrupt(s) associated with the target memory cells and the adjacent memory cells. For example, the adjacent memory cells in the erase state E and the first through third program states P1 through P3 which have a low read interrupt degree may include memory cells of a first group, because the threshold voltages of these particular memory cells are relatively low. Whereas, adjacent memory cells in the fourth through seventh program states P4 through P7 which have a high read interrupt degree may include memory cells of a second group, because the threshold voltages of these particular memory cells are relatively high. In other words, when the control logic 120 receives adjacent data resulting from a read operation directed to the adjacent memory cells (e.g., from a latch connected to the first bit line BL commonly connected to target memory cells), a grouping of target memory cells may be determined according to the read result of the adjacent memory cell(s).

Referring to FIG. 4, although the target memory cells have been described by using the voltage distributions classifying the target memory cells into one of two groups according to the read result of the adjacent memory cells, the scope of the inventive concept is not limited thereto, and the control logic 120 may classify the target memory cells into three or more groups according to the read result of the adjacent memory cells.

Figure 5:
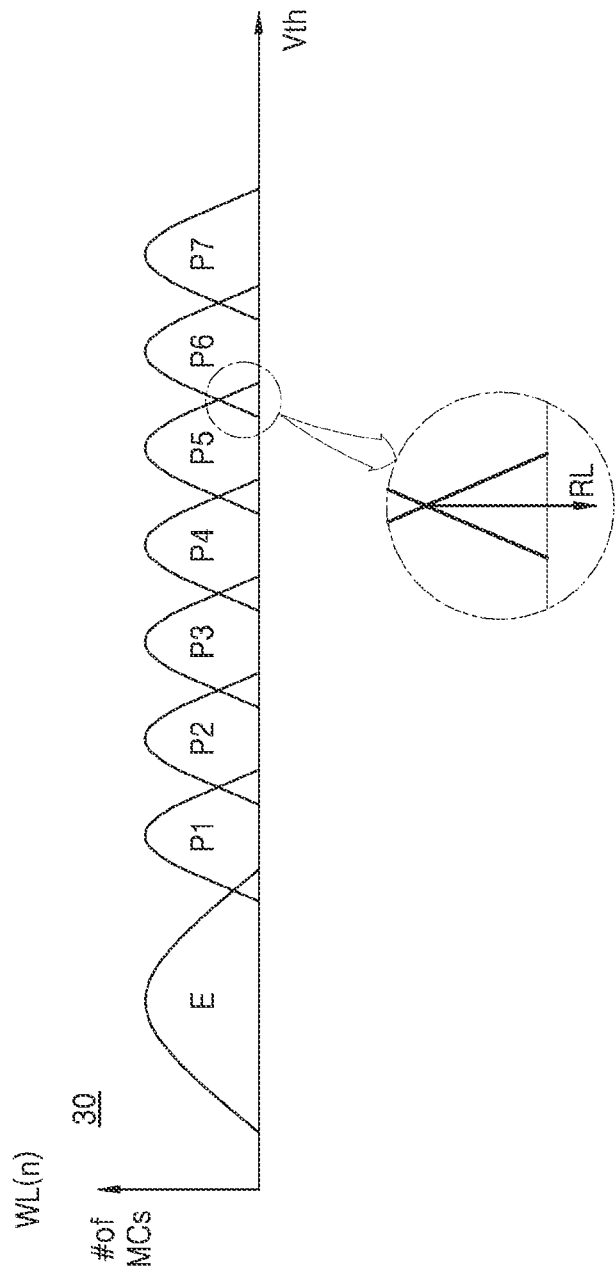

Referring to FIG. 5, the read result of the target memory cells may be classified into the erase state E and the first through seventh program states P1 through P7 according to the read voltage levels. The memory device 100 may determine a program state of a memory cell based on a number of preset read voltage levels, and the read voltage level may be a voltage level that is determined based on respective valleys between adjacent program states. Thus, according to the example of FIG. 5, the read voltage level RL for determining the fifth program state P5 and the sixth program state P6 among all target memory cells MC may be a pre-stored voltage level according to a valley between the fifth program state P5 and the sixth program state P6.

Figure 6:
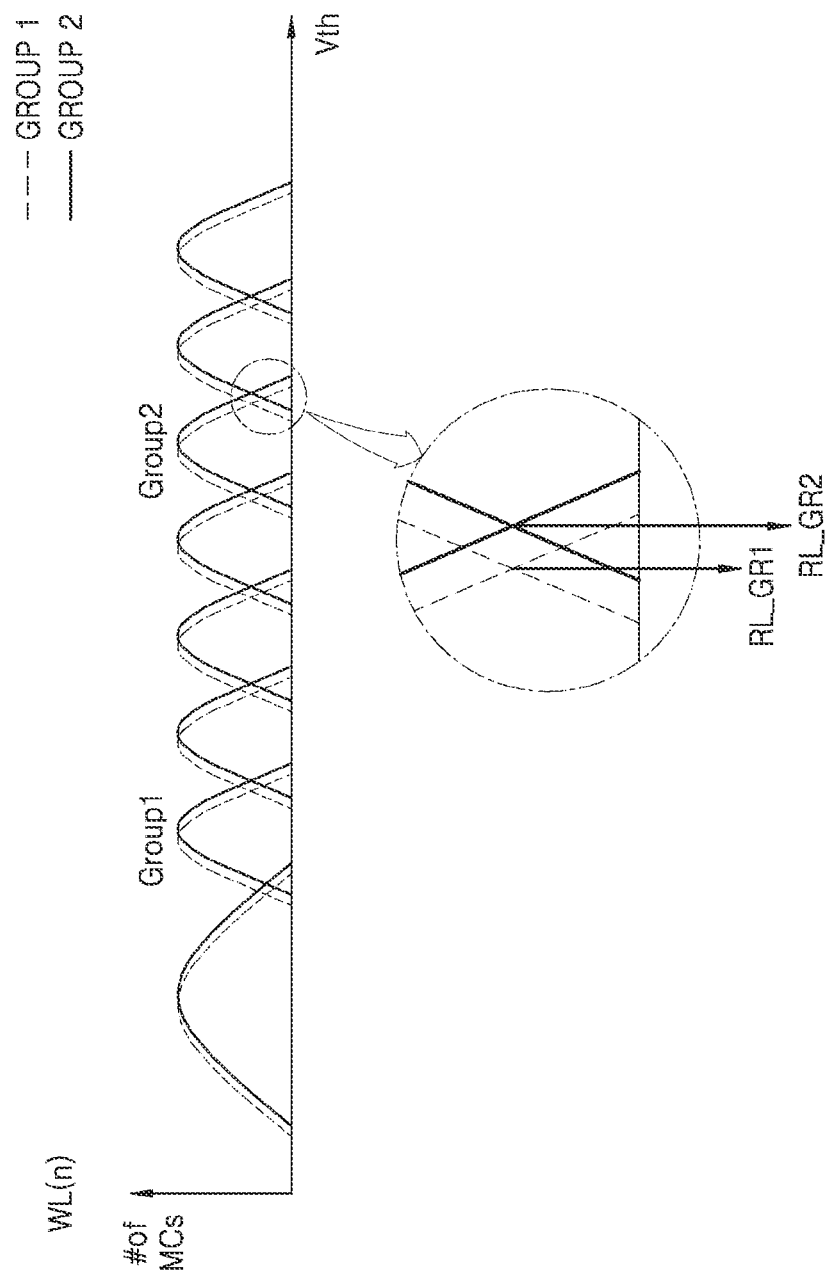

However, referring to FIG. 6, the control logic 120 may set the read voltage level for each group of the target memory cells connected to the target word line WL(n). In other words, the control logic 120 may classify and set the read voltage levels for the target memory cells for each group according to the read interrupt levels associated with the target memory cells, as well as adjacent memory cells. For example, according to the embodiment of FIG. 4, the first group may include the target memory cells sharing a bit line BL with an adjacent memory cell having a relatively low read interrupt level, and the second group may include the target memory cells sharing a bit line BL with an adjacent memory cell having a relatively high read interrupt level.

The control logic 120 may set the read voltage level for each group by searching for the read voltage level of memory cells of at least one group among the target memory cells that are classified into different groups. For example, the control logic 120 may reset a new read voltage level from a predetermined default read voltage level, by searching for the read voltage level by differentiating the read voltage level for the first group RL_GR1 from the read voltage level for the second group RL_GR2, and may perform the read operation on the target memory cells based on the read voltage level set for each group. However, the control logic 120 is not limited thereto, and may reset the read voltage level of the second group by searching for the read voltage level for only the second group.

When the adjacent memory cell is programmed to a high voltage value and the read interrupt level is high, the threshold voltage of the target memory cell MC may be increased. Accordingly, the control logic 120 may improve read accuracy by resetting the read voltage level for reading the target memory cell MC connected to the adjacent memory cell MC having a high read interrupt level.

Figure 7:
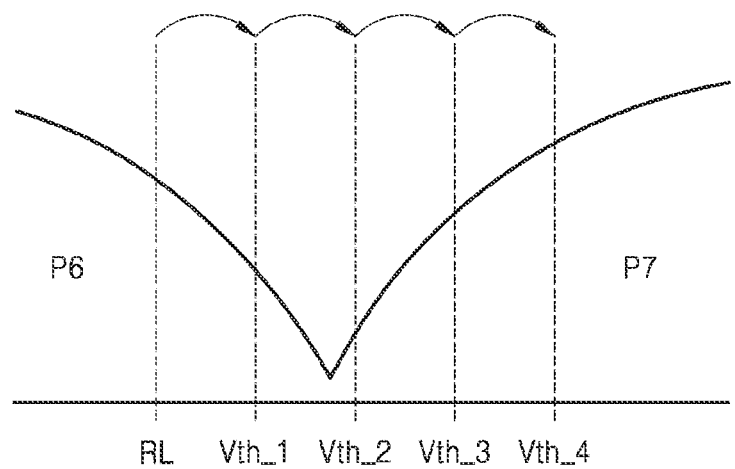

Referring to FIG. 7, the control logic 120 may search for the read voltage level for the first group of a target memory cell group. The control logic 120 may count the number of memory cells MC corresponding (e.g.,) to first, second, third and fourth peripheral voltage levels $Vth\_1$ through $Vth\_4$ around a preset default read voltage level RL for a first memory cell group. Then, the control logic 120 may set one of the first, second, third and fourth peripheral voltage levels $Vth\_1$ through $Vth\_4$ as the first read voltage level for the first memory cell group. In some embodiments, the first, second, third and fourth peripheral voltage levels $Vth\_1$ through $Vth\_4$ may be arbitrary voltage levels deviating up and down from the default read voltage level.

The control logic 120 may count the number of memory cells MC corresponding to the first, second, third and fourth peripheral voltage levels $Vth\_1$ through $Vth\_4$, and select the peripheral voltage level having a lowest number of counted memory cells MC as the read voltage level. Thus, according to the embodiment illustrated in FIG. 7, the control logic 120 may count the number of target memory cells corresponding to each of the first, second, third and fourth peripheral voltage levels $Vth\_1$ through $Vth\_4$ around the default read voltage RL. When the number of target memory cells counted at the second peripheral voltage level $Vth\_2$ is determined to be less than the numbers of target memory cells MC counted at the first, third, and fourth peripheral voltage levels $Vth\_1$, $Vth\_3$, and $Vth\_4$, the control logic 120 may select (or set) the second peripheral voltage level $Vth\_2$ as the read voltage level.

Of note, the embodiment illustrated in FIG. 7 assumes a setting of a read voltage level that may be effectively used to differentiate the sixth program state P6 from the seventh program state P7 of the first group. Those skilled in the art will, however, recognize that this particular example is merely exemplary of many read voltage level settings that may occur in various embodiments of the inventive concept, as well as the resulting read result classifications.

Figure 8:
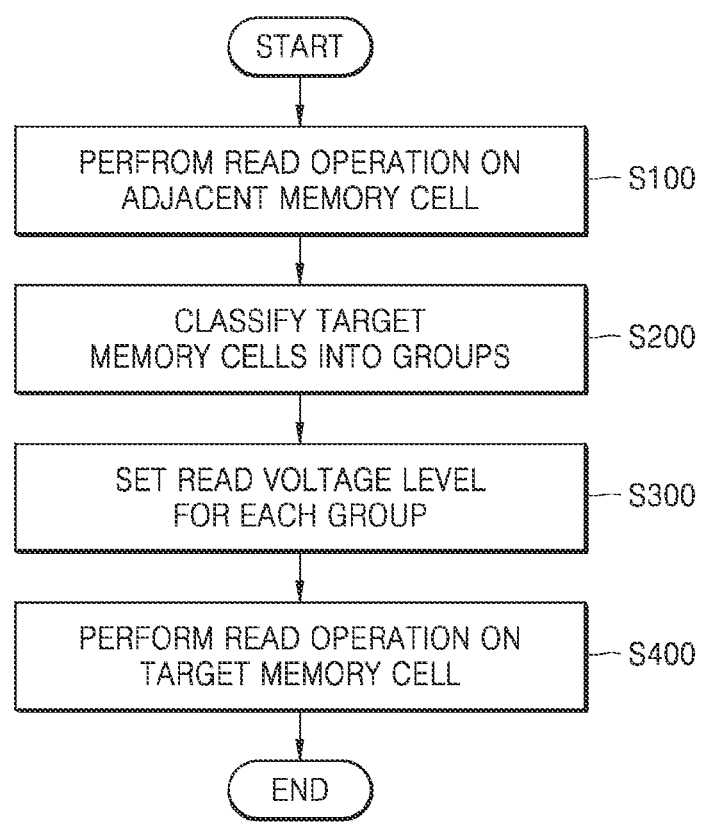
FIG. 8 is a flowchart summarizing a method of operating a non-volatile memory device according to embodiments of the inventive concept.

FIG. 8 is a flowchart summarizing a method of operating a non-volatile memory device according to embodiments of the inventive concept. Here, a non-volatile memory device according to embodiments of the inventive concept may perform a method of setting one or more read voltage level(s) using the control logic 120. However, other embodiments of the inventive concept may set the one or more read voltage level(s) using an external memory controller, for example.

Referring to FIGS. 1, 2 and 8, the control logic 120 of the memory device 100 may perform a read operation on adjacent memory cells (e.g., memory cells connected to an adjacent word line WL proximate to a target word line WL connecting a target memory cell) (S100). For example, the control logic 120 may perform the read operation, and control the page buffer 150 to store the read data (e.g., read data including target data and adjacent data) in a latch of the page buffer 150.

The control logic 120 may then classify the target memory cell into one of a number of groups according to the adjacent data obtained by reading the adjacent memory cells (S200). In some embodiments, the target memory cell may be physically proximate to the adjacent memory cells (e.g., a memory cell that shares a bit line BL in a memory cell array with the adjacent memory cells). The control logic 120 may identify the read result of the adjacent memory cells, and then determines into which group the target memory cell belongs.

For example, when the adjacent data read from the adjacent memory cell may have one of eight (8) possible states including an erase state E, four (4) states among the eight program states may be designated as a first group, and the remaining four (4) states among the eight program states may be designated as a second group. In this case, when the read result of the adjacent memory cells is in the program state indicating the first group, the control logic 120 may designate the target memory cell as the first group, or when the read result of the adjacent memory cell is in the program state indicating the second group, the control logic 120 may designate the target memory cell MC as the second group.

The control logic 120 may then set the read voltage level for each group, as classified (S300). The control logic 120 may search for the read voltage level for each group among all groups, and set the found read voltage level as a new read voltage level, but may search for the read voltage level for only some groups and set the found read voltage level as the new read voltage level.

In some embodiments, the control logic 120 may not search for the read voltage levels for some groups that are determined to have a lower read interrupt level than other groups among the groups, but instead, and may search for the read voltage levels for only the remaining groups that are determined to have a relatively high read interrupt level.

The control logic 120 may perform the read operation on the target memory cell using (or based on) the read voltage level set for the group to which the target memory cell belongs (S400). In this regard, general control logic may not be capable of reflecting the appropriate level of the threshold voltage Vth according to the read interrupt by performing the read operation on the target memory cells MC connected to the target word line WL at a consistent read voltage level, but when the read operation is performed based on the read voltage level set for each group according an embodiment of the inventive concept, an accurate read operation may be performed properly reflecting an appropriate level of the read interrupt.

When the word lines WL are stacked in a three dimensional arrangement in certain embodiments of the inventive concept, that is, when the word lines WL are vertically stacked on the substrate, the three-dimensional word lines WL may have different, respective specifications according (e.g.,) to a trenching degree (an exemplary process variation), and differing interrupt degree(s) between adjacent word lines WL across a range of chips and/or blocks. In addition, voltage distributions vary from each other according to a number of read cycles, write cycles, erase cycles and/or data retention time(s).

As will be understood by those skilled in the art upon consideration of the foregoing, a memory device, like the memory device 100 of FIG. 1, according to an embodiment of the inventive concept may reduce errors in read data by adaptively setting read voltage levels, thereby improving data reliability by searching for an appropriate read voltage level based on a read interrupt level as between adjacent word lines.

Figure 9:
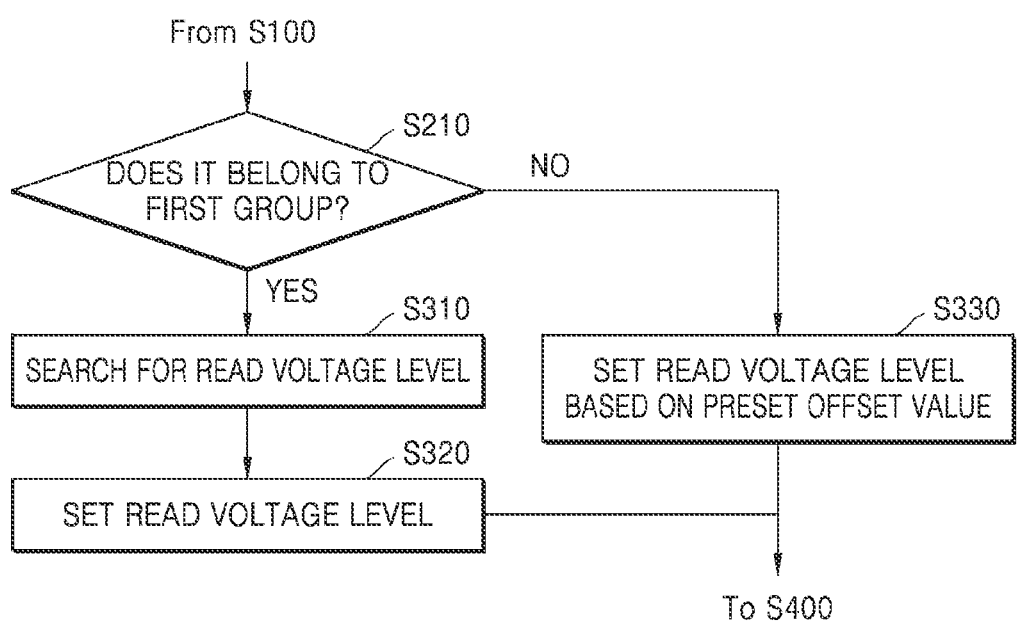
FIG. 9 is a flowchart summarizing a method of setting a read voltage level for respective group(s) of memory cells according to embodiments of the inventive concept.

FIG. 9 is a flowchart summarizing a method of setting a read voltage level for a group according to embodiments of the inventive concept.

Referring to FIGS. 1, 2, 8 and 9, the memory device 100 may search for the read voltage level only for the target memory cell corresponding to the adjacent memory cell(s) that has been determined to have a greater influence on the read interrupt than other adjacent memory cell(s). Thus, the memory device 100 may not search for the read voltage level for adjacent memory cells that are determined to have a lesser influence on the read interrupt, and may (e.g.,) maintain a previously stored default read voltage level, or (e.g.,) may set the read voltage level according to a predetermined offset value. Thus, according to the embodiment of FIG. 9, the target memory cell determined to have a large influence on the read interrupt may be classified as the first group.

The memory device 100 may perform the read operation on the adjacent memory cells connected to (or associated with) an adjacent word line WL, and at least temporarily store adjacent data read from the adjacent memory cells according (e.g.,) in units of bit lines BL.

The control logic 120 of the memory device 100 may classify the target memory cell into one of a number of groups by determining whether the target memory cell belongs in a first group (S210). For example, the control logic 120 may determine whether the influence of the read interrupt to the target memory cell is relatively large according to adjacent data read from the adjacent memory cells, and classify the target memory cell corresponding to the adjacent data that have been determined to have a relatively large read interrupt effect into the first group.

If the control logic determines that the target memory cell does belong in the first group (S210=YES), the control logic 120 may search for the read voltage level for the target memory cells as belonging to the first group (S310). For example, the control logic 120 may use the approach described in relation to the embodiment of FIG. 7 to search for the read voltage level. Then, the control logic 120 may select the read voltage level as a new read voltage level corresponding to the first group, and perform the read operation on the target memory cell (S320).

On the other hand, if the control logic 120 determines that the target memory cell does not belong in the first group (e.g., the target memory cell corresponding to the adjacent memory cells is determined to have a relative small read interrupt effect), the control logic 120 may set the read voltage level for another group based on a preset offset value (S330). The other group in this regard may be a group having a lower read interrupt level than the first group, and in this case, the control logic 120 may set a new read voltage level based on the preset offset value.

According to embodiments of the inventive concept, even when a target memory cell is properly programmed, trapped charges be lost over time and the threshold voltages of the target memory cell may decrease. Accordingly, the control logic 120 may set a new read voltage level by applying the preset offset value to the read voltage level of another group (i.e., a group other than the first group in the foregoing example). For example, the control logic 120 may set the new read voltage level by subtracting the offset value from the default read voltage level for the other group. However, the control logic 120 is not limited thereto, and may set the new read voltage level by adding the offset value to the read voltage level.

Of note, the embodiment of FIG. 9 assumes the determination of group membership (and possibly a resulting search for a read voltage level) for only a single group, but the inventive concept is not limited thereto, and the control logic 120 may search for a number of read voltage levels associated with a number of groups that are determined to have a relatively large read interrupt level.

Thus, according to the embodiment of the inventive concept like the one described in relation to FIG. 9, the control logic 120 may search for the read voltage level only for a target memory cell that has been determined to have a relatively large read interrupt effect, and may set the red voltage level by efficiently considering the read interrupt, by searching for the read voltage level for some groups instead of searching for the read voltage levels for all groups.

Figure 10:
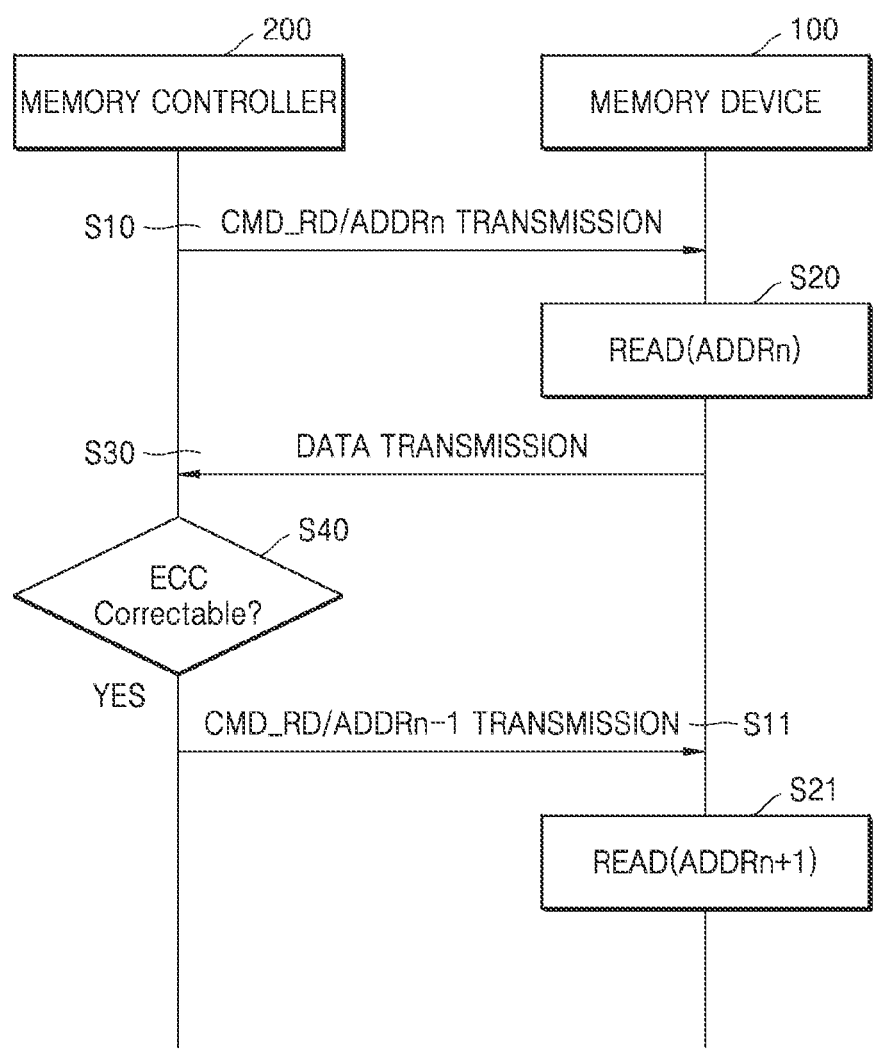
FIGS. 10 and 11 are respective flow diagrams illustrating certain read operations that may be performed in embodiments of the inventive concept.
Figure 11:
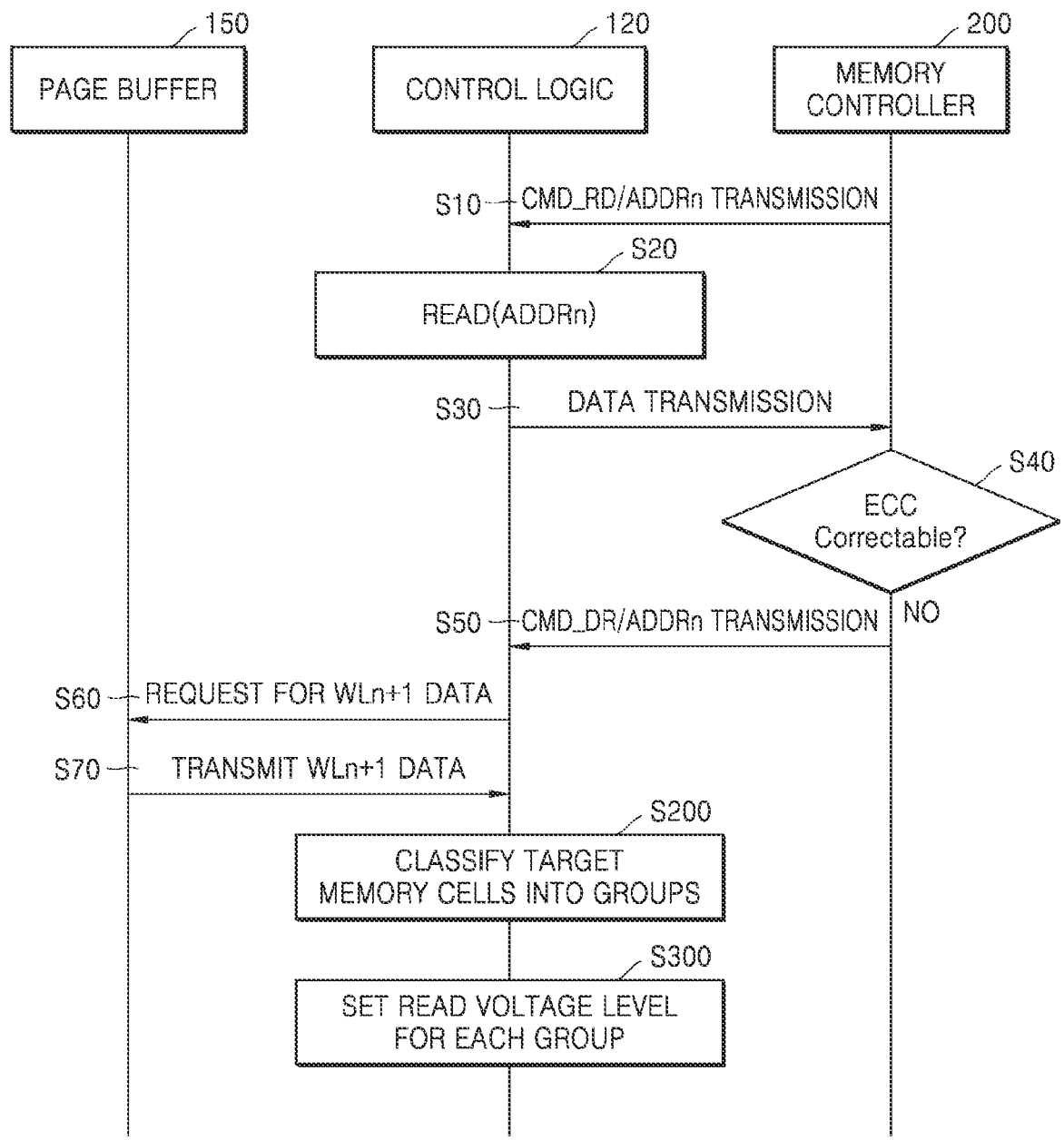

FIGS. 10 and 11 are flow diagrams illustrating the execution of read operations according to embodiments of the inventive concept. FIG. 10 illustrates the execution of a read operation in the memory system of FIG. 1 when a read error is correctable, and FIG. 11 illustrates the execution of a read operation the memory system 100 of FIG. 1 when a read error is uncorrectable.

Referring to FIGS. 1, 2 and 10, the memory system of FIG. 1 may determine whether or not read error(s) occurring in data read from memory cells connected to a selected word line WL is correctable before searching for the read voltage level. That is, the memory controller 200 may provide the memory device 100 with a read command CMD_RD indicating a read operation directed to the $n^{th}$ address (ADDRn) of a target memory cells (S10). In this regard, the memory device 100 may receive a preset default read voltage level along with the command signal CMD_RD and the $n^{th}$ address ADDRn from the memory controller 200, and the memory device 100 may perform the read operation directed to the $n^{th}$ address using the default read voltage level (S20).

Upon execution of the read operation, the memory device 100 may transmit the resulting read data to the memory controller 200 (S30), where the read data may be arranged as a series of bits derived by reading the various program states of the target memory cells connected to the selected word line WL.

The memory controller 200 may then determine whether error(s) detected among the read data are correctable using a constituent ECC (S40). If it is determined that error(s) are correctable using an ECC operation, the memory controller 200 may perform an ECC decoding operation to correct the error(s), and the read operation directed to the $n^{th}$ address ADDRn is complete.

Once the read operation directed to the $n^{th}$ address is complete, the memory controller 200 may transmit another read command CMD_RD directed to an $(n-1)^{th}$ address (ADDRn-1) to the memory device 100 in order to perform a read operation directed to the $(n-1)^{th}$ address ADDRn-1 (S11), whereupon the memory device 100 performs the read operation directed to the $(n-1)^{th}$ address ADDRn-1 (S21).

In this regard, the embodiment described in relation to FIG. 10 illustrates a case in which a read operation is performed on each word line WL of the memory cell array, wherein the read operation may be completed without resetting a separate read voltage level because the read data has been determined to be correctable by the ECC operation.

Referring to FIGS. 1, 2 and 11, the memory system of FIG. 1 may once again determine whether read error(s) occurring in data read from memory cells connected to a selected word line WL are correctable before searching for the read voltage level.

Operations S10, S20, S30 and S40 may be the same as the similarly denoted, respective operations previously described in relation to FIG. 10.

However, once the memory controller 200 determines that the error(s) among the read data are not correctable using the constituent ECC operation, a data recovery command CMD_DR indicating a data recovery operation directed to the $n^{th}$ address ADDRn may be transmitted from the memory controller 200 to the control logic 120 of the memory device 100 (S50).

Upon receiving the data recovery command CMD_RD, the control logic 120 may request that the page buffer 150 provide adjacent data previously read from an adjacent word line WLn+1 in order to reset the read voltage level (S60). In response, the page buffer 150 may provide read data including adjacent data stored in latches connected to at least one bit line BL, wherein the latches may be used to temporarily store data read (or sensed) from adjacent memory cells connected to the adjacent word line WLn+1. Accordingly, the page buffer 150 may transmit read data including at least the adjacent data read from memory cells connected to the adjacent word line WLn+1 to the control logic 120 in response the request received from the control logic 120 (S70).

Thereafter, the control logic 120 of the memory device 100 may classify the target memory cells into groups in accordance with the adjacent data (S200) provided by the page buffer 150. Then, the control logic 120 may set the read voltage level for each group (S300). Here, the operations S200 and S300 may be the same as similarly denoted, respective operations previously described in relation to FIG. 8.

According to embodiments of FIGS. 10 and 11, although the memory controller 200 receives read data from the memory device 100 and determines whether the read data includes error(s), the control logic 120 of the memory device 100 may nonetheless be used to determine whether the error(s) have occurred in the read data.

Figure 12:
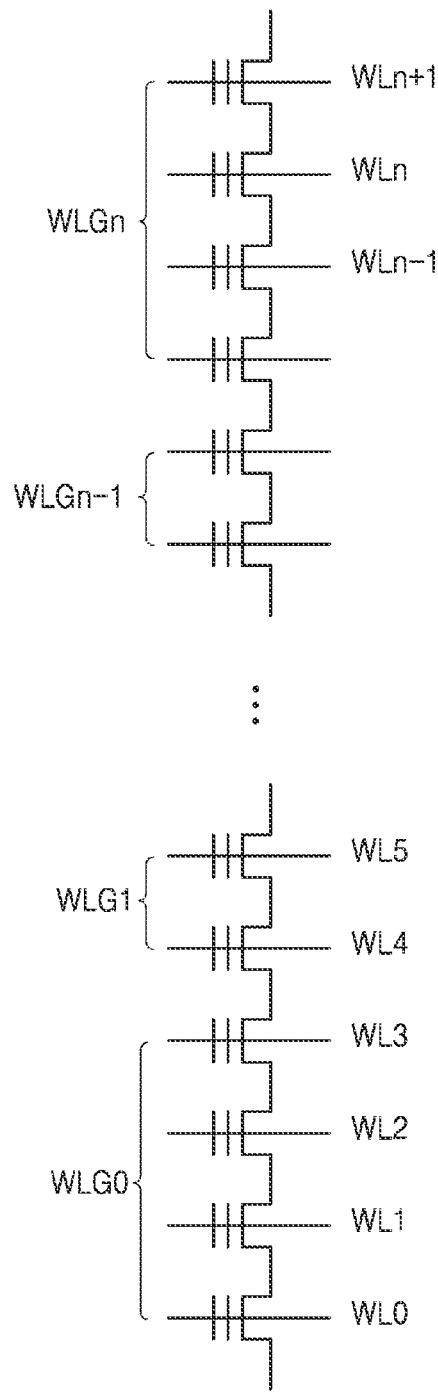
FIG. 12 is a circuit diagram illustrating in relevant part a memory cell array including a word line group according to embodiments of the inventive concept.

FIG. 12 is a circuit diagram illustrating, in relevant part, a memory cell array including a word line group according to embodiments of the inventive concept;

Referring to FIGS. 1, 2 and 12, the control logic 120 may set the read voltage level, which is set for the target word line WL, as the read voltage level for all word lines WL included in the memory cell array. Although the read interrupt degree between adjacent word lines WL varies for each word line WL, because the word lines WL in the same memory cell array often have the same read cycle or retention time, the difference in the read interrupt degree between adjacent word lines WL may not be large when the word lines WL are in the same memory cell array. Accordingly, by setting the read voltage level for the target word line WL, which is one of the memory cell arrays, and setting the remaining word lines WL to the same read voltage level as the target word line WL, the read error may be efficiently corrected.

According to another embodiment, the memory cell array may include 0-th through n-th word line groups (e.g., WLG0 through WLGn), and the control logic 120 may set a read voltage level for each of the 0-th through n-th word line groups. Here, the word line WL may, due to a process, voltage or temperature variation, have a difference between the read voltage level of the lowermost word line WL and the real voltage level of the uppermost word line WL. By setting the read voltage level for each word line group consisting of the plurality of word lines WL, instead of setting the same read voltage level for all word lines WL, the read voltage level may be more accurately set.

The embodiments described in relation to FIGS. 1 through 12 may be embodiments in which the memory cell grouping unit 121 and the RL setting unit 122 are used to classify the target memory cells into groups, and the read voltage level is set for each group by searching for the read voltage level for the target memory cells of at least one group.

Figure 13:
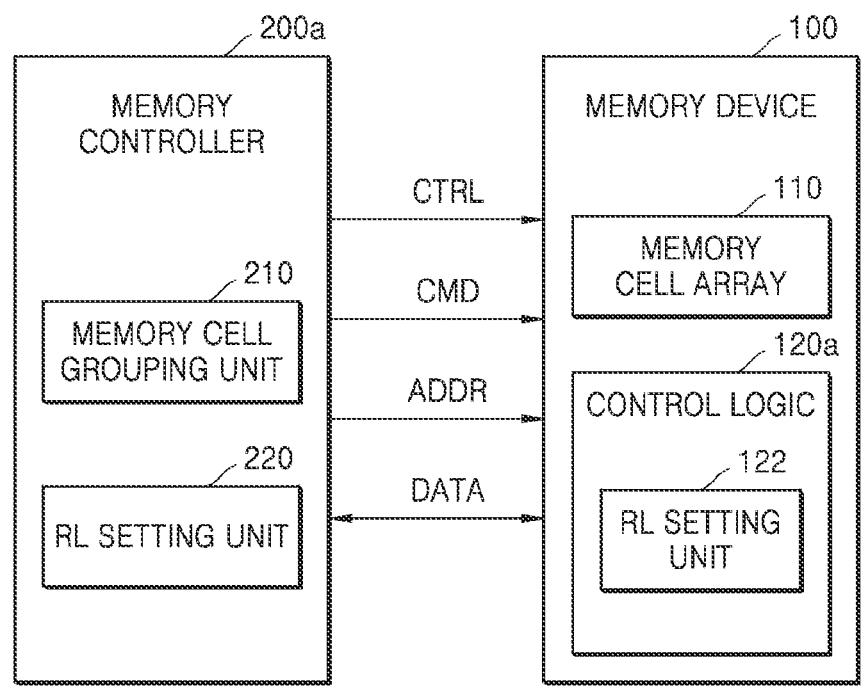
FIG. 13 is a block diagram illustrating a non-volatile memory system according to embodiments of the inventive concept.

FIG. 13 is a block diagram illustrating a non-volatile memory system according to embodiments of the inventive concept.

Referring to FIG. 13, a control logic 120a may include a read controller 122 and a memory controller 200a may include a memory cell grouping unit 210 and an RL setting unit 220. The control logic 120 of the memory device 100 may be used to control the execution of read operations, and the memory cell grouping unit 210 and the RL setting unit 220 of the memory controller 200 may be used to classify the target memory cells into groups, and set the read voltage level for each group. Otherwise, the descriptions given above with reference to FIGS. 1 through 12 may be applied to the embodiment of FIG. 13.

Figure 14:
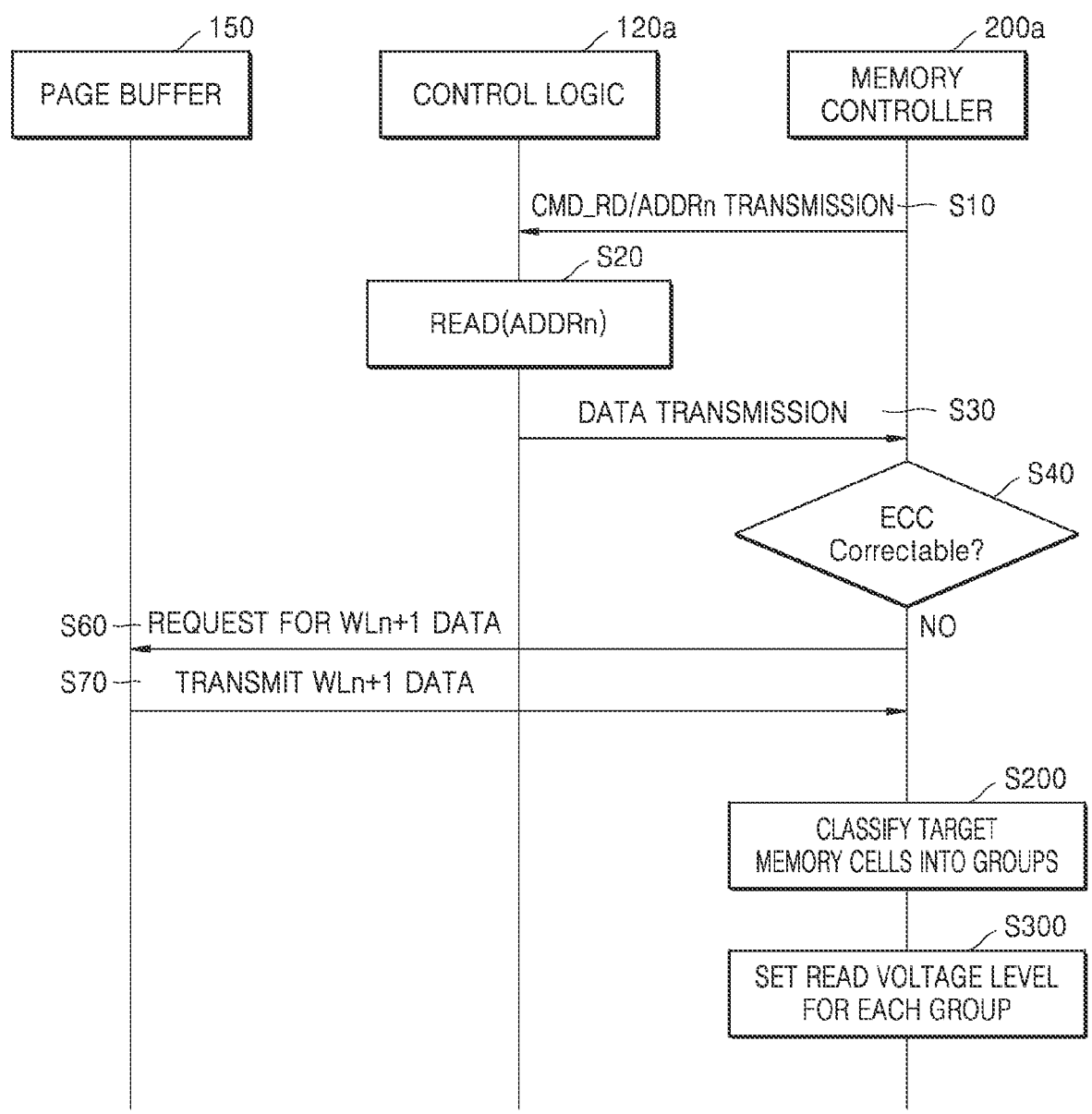
FIG. 14 is a flow diagram illustrating a read operation that may be performed by embodiments of the inventive concept.

FIG. 14 is a flow diagram illustrating the execution of a read operation in a memory system according to embodiments of the inventive concept.

Here, a memory system according to embodiments of the inventive concept may determine whether or not error(s) detected in data read from memory cells connected to a word line WL are correctable before searching for the read voltage level. Once again, operations S10, S20, S30 and S40 may be the same as the similarly denoted, respective operations previously described in relation to FIGS. 10 and 11.

However, when the memory controller 200a determines that the error(s) are not correctable using a constituent ECC operation, the memory controller 200a may issue a request for the page buffer 150 to provide adjacent data read from memory cells connected to an adjacent word line WLn+1 in order to reset the read voltage level (S60). In response, the page buffer 150 transmit read data including at least the adjacent data to the memory controller 200a (S70).

Thus, the memory controller 200a having received the adjacent data, may classify the target memory cells into groups according to the adjacent data (S200), set a read voltage level for each group (S300). Here again, the operations S200 and S300 may be the same as the similarly denoted, respective operations previously described with reference to FIG. 8.

In this manner words, although the control logic 120 may set the read voltage level for each group of target memory cells according to the embodiment of FIG. 11, the memory controller 200a may set the read voltage level according to the embodiment of FIG. 14.

Figure 15:
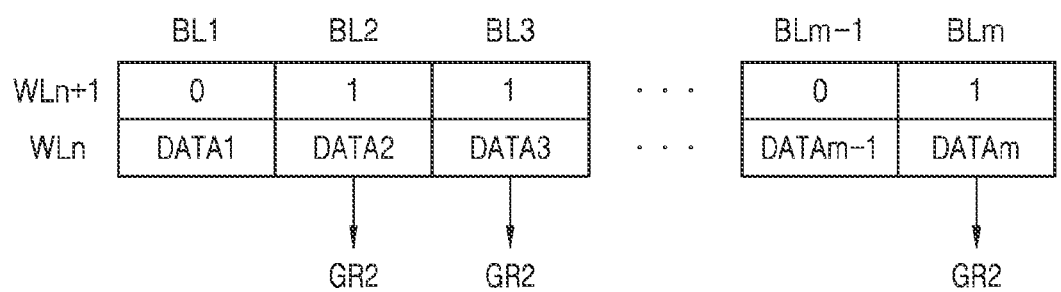
FIGS. 15 and 16 are respective conceptual diagrams illustrating methods of setting a group of memory cells according to embodiments of the inventive concept.
Figure 16:
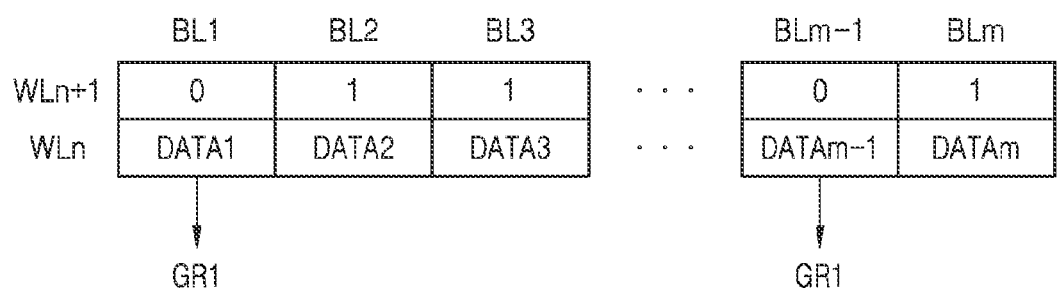

FIGS. 15 and 16 are conceptual diagram respectively illustrating the setting of group(s) of memory cells according to embodiments of the inventive concept.

Here, a memory controller (200 or 200a) may classify target memory cells into groups by matching a read result of an adjacent memory cell, which has been classified with respect to a logical "high" or a logical "low", with a read result of the target memory cell. The group of adjacent memory cells may be classified as high or low according to a read interrupt degree of the adjacent memory cell using the read result of the adjacent memory cell (i.e., at least a portion of the adjacent data). For example, the adjacent memory cells having a threshold voltage greater than a reference voltage value based on the reference voltage value may be classified into a group having a high bit, and the adjacent memory cells having a threshold voltage less than the reference voltage value may be classified into a group having a low bit. Referring to FIG. 4, the adjacent memory cells indicating the first group GR1 may be classified into a group having a low bit, and the adjacent memory cells indicating the second group GR2 may be classified into a group having a high bit.

In some embodiments, the memory controller (200 or 200a) may classify the adjacent memory cells into groups based on the read result of the adjacent memory cells, but is not limited thereto, and the adjacent memory cells may be classified into groups by an external memory controller. When the adjacent memory cells are classified into groups by the external memory controller, the memory device may also receive the group indicated by the adjacent memory cells, but may also transmit data of target memory cells to the external memory controller.

FIG. 15 illustrates a case wherein the adjacent memory cells are classified into a group having a high bit according to adjacent data (e.g., the memory controller classifies the target memory cells into the second group GR2).

Thus, high and low bit values may be arranged in the order of bit lines in the adjacent word line WLn+1, and the memory controller may classify the target memory cells into groups by matching the target memory cell of the target word line WLn with the adjacent memory cell of the adjacent word line WLn+1 that shares the same bit line with the target memory cell. For example, the memory controller may set the target memory cells, which correspond to the remaining data without having been erased, into the second group GR2, by multiplying the bit value of the adjacent word line WLn+1 and the bit value of the target word line WLn corresponding thereto. For example, the memory controller may search for the read voltage level of the second group GR2 by using a threshold voltage value corresponding to the target memory cell of the second group GR2.

FIG. 16 illustrates a case wherein the adjacent memory cells are classified into a group having a low bit, according to adjacent data (e.g., the memory controller classifies the target memory cells into the second group GR1).

Thus, high and low bit values of the adjacent word line WLn+1 may be inverted, and the memory controller may classify the target memory cells indicating the adjacent memory cell of a logic low bit into the first group GR1, by matching the target memory cell of the target word line WLn with the adjacent memory cell of the adjacent word line WLn+1 that shares the same bit line with the target memory cell. For example, the memory controller may classify the target memory cells, which correspond to the remaining data without having been erased, into the first group GR1, by multiplying the inverted bit value of the adjacent word line WLn+1 by bit value of the target word line WLn corresponding thereto. For example, the memory controller may search for the read voltage level of the first group GR1 by using a threshold voltage value corresponding to the target memory cell of the first group GR1.

Classifying target memory cells into groups according to the embodiments of FIGS. 15 and 16 need not always use adjacent data stored in a page buffer latch internal to the memory device 100, but may instead use data provided by an external controller.

Figure 17:
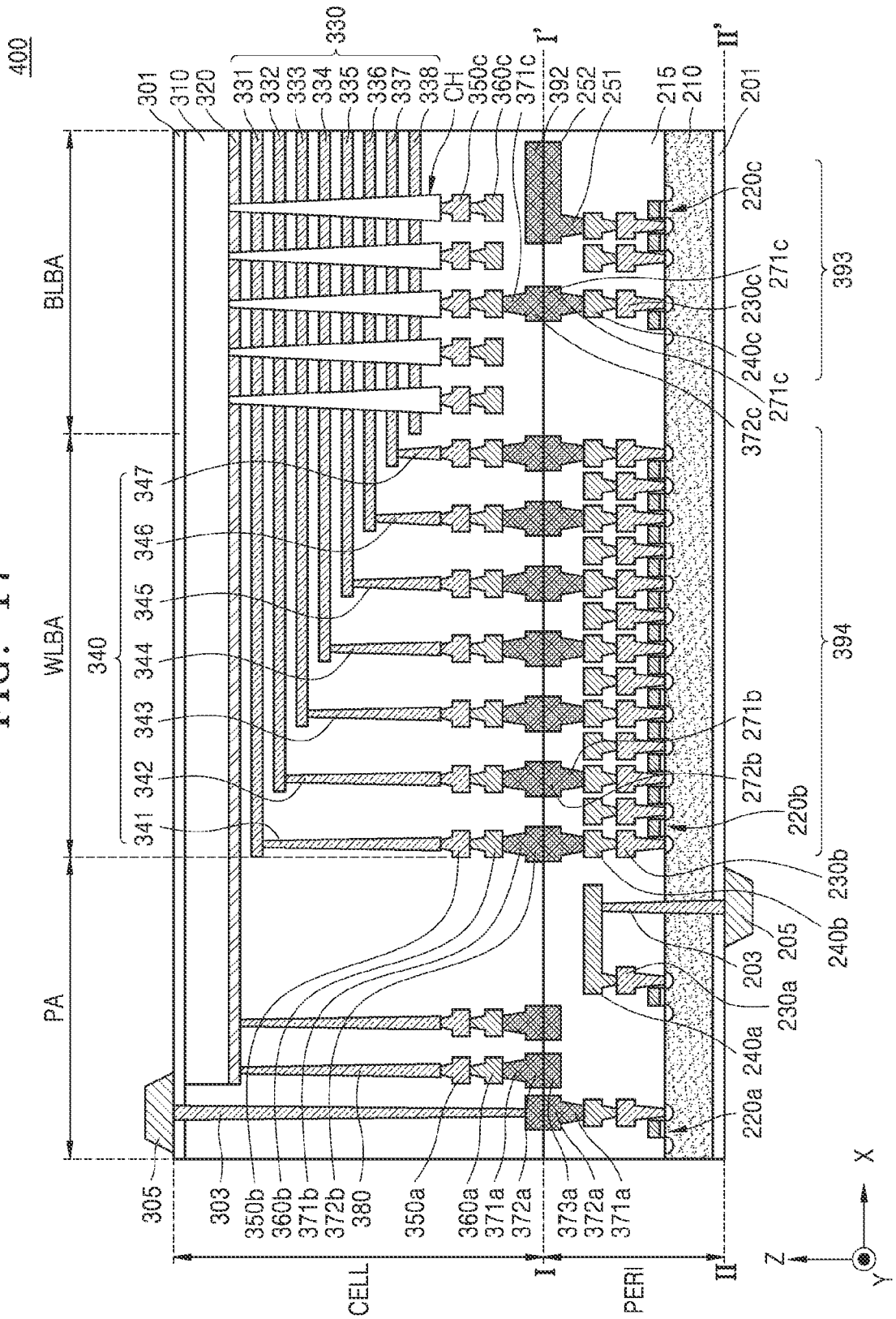
FIG. 17 is a cross-sectional diagram illustrating a memory device 400 having a chip-to-chip (C2C) structure.

FIG. 17 is a cross-sectional view of a relevant portion of a memory device 400 having a chip-to-chip (C2C) structure according to certain embodiments of the inventive concept. The C2C structure may refer to a structure formed by manufacturing an upper chip including a cell region CELL on a first wafer, manufacturing lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 40 may include an external pad bonding area PA, a word line bonding area WLBA, and a bit line bonding area BLBA.

The peripheral circuit region PERI may include a first substrate 210, an interlayer insulating layer 215, a plurality of circuit elements 220a, 220b, and 220c formed on the first substrate 210, first metal layers 230a, 230b, and 230c respectively connected to the plurality of circuit elements 220a, 220b, and 220c, and second metal layers 240a, 240b, and 240c formed on the first metal layers 230a, 230b, and 230c. In an example embodiment, the first metal layers 230a, 230b, and 230c may be formed of tungsten having relatively high resistance, and the second metal layers 240a, 240b, and 240c may be formed of copper having relatively low resistance.

In the illustrated example of FIG. 17, although the first metal layers 230a, 230b, and 230c and the second metal layers 240a, 240b, and 240c are shown and described, they are not limited thereto, and one or more metal layers may be further formed on the second metal layers 240a, 240b, and 240c. At least a portion of the one or more metal layers formed on the second metal layers 240a, 240b, and 240c may be formed of aluminum or the like having a lower resistance than those of copper forming the second metal layers 240a, 240b, and 240c.

The interlayer insulating layer 215 may be disposed on the first substrate 210 and cover the plurality of circuit elements 220a, 220b, and 220c, the first metal layers 230a, 230b, and 230c, and the second metal layers 240a, 240b, and 240c. The interlayer insulating layer 215 may include an insulating material such as silicon oxide, silicon nitride, or the like.

Lower bonding metals 271b and 272b may be formed on the second metal layer 240b in the word line bonding area WLBA. In the word line bonding area WLBA, the lower bonding metals 271b and 272b in the peripheral circuit region PERI may be electrically connected to c in a bonding manner, and the lower bonding metals 271b and 272b and the upper bonding metals 371b and 372b may be formed of aluminum, copper, tungsten, or the like. Further, the upper bonding metals 371b and 372b in the cell region CELL may be referred as first metal pads and the lower bonding metals 271b and 272b in the peripheral circuit region PERI may be referred as second metal pads.

The cell region CELL may include at least one memory block. The cell region CELL may include a second substrate 310 and a common source line 320. On the second substrate 310, a plurality of word lines 331 to 338 (i.e., 330) may be stacked in a direction(a Z-axis direction), perpendicular to an upper surface of the second substrate 310. At least one string select line and at least one ground select line may be arranged on and below the plurality of word lines 330, respectively, and the plurality of word lines 330 may be disposed between the at least one string select line and the at least one ground select line.

In the bit line bonding area BLBA, a channel structure CH may extend in a direction, perpendicular to the upper surface of the second substrate 310, and pass through the plurality of word lines 330, the at least one string select line, and the at least one ground select line. The channel structure CH may include a data storage layer, a channel layer, a buried insulating layer, and the like, and the channel layer may be electrically connected to a first metal layer 350c and a second metal layer 360c. For example, the first metal layer 350c may be a bit line contact, and the second metal layer 360c may be a bit line. In an example embodiment, the bit line 360c may extend in a first direction (a Y-axis direction), parallel to the upper surface of the second substrate 310.

In the illustrated example of FIG. 17, an area in which the channel structure CH, the bit line 360c, and the like are disposed may be defined as the bit line bonding area BLBA. In the bit line bonding area BLBA, the bit line 360c may be electrically connected to the circuit elements 220c providing a page buffer 393 in the peripheral circuit region PERI. For example, the bit line 360c may be connected to upper bonding metals 371c and 372c in the cell region CELL, and the upper bonding metals 371c and 372c may be connected to lower bonding metals 271c and 272c connected to the circuit elements 220c of the page buffer 393.

In the word line bonding area WLBA, the plurality of word lines 330 may extend in a second direction (an X-axis direction), parallel to the upper surface of the second substrate 310, and may be connected to a plurality of cell contact plugs 341 to 347 (i.e., 340). The plurality of word lines 330 and the plurality of cell contact plugs 340 may be connected to each other in pads provided by at least a portion of the plurality of word lines 330 extending in different lengths in the second direction. A first metal layer 350b and a second metal layer 360b may be connected to an upper portion of the plurality of cell contact plugs 340 connected to the plurality of word lines 330, sequentially. The plurality of cell contact plugs 340 may be connected to the circuit region PERI by the upper bonding metals 371b and 372b of the cell region CELL and the lower bonding metals 271b and 272b of the peripheral circuit region PERI in the word line bonding area WLBA.

The plurality of cell contact plugs 340 may be electrically connected to the circuit elements 220b providing a row decoder 394 in the peripheral circuit region PERI. In an example embodiment, operating voltages of the circuit elements 220b providing the row decoder 394 may be different than operating voltages of the circuit elements 220c providing the page buffer 393. For example, operating voltages of the circuit elements 220c providing the page buffer 393 may be greater than operating voltages of the circuit elements 220b providing the row decoder 394.

A common source line contact plug 380 may be disposed in the external pad bonding area PA. The common source line contact plug 380 may be formed of a conductive material such as a metal, a metal compound, polysilicon, or the like, and may be electrically connected to the common source line 320. A first metal layer 350a and a second metal layer 360a may be stacked on an upper portion of the common source line contact plug 380, sequentially. For example, an area in which the common source line contact plug 380, the first metal layer 350a, and the second metal layer 360a are disposed may be defined as the external pad bonding area PA.

Input-output pads 205 and 305 may be disposed in the external pad bonding area PA. Referring to FIG. 17, a lower insulating film 201 covering a lower surface of the first substrate 210 may be formed below the first substrate 210, and a first input-output pad 205 may be formed on the lower insulating film 201. The first input-output pad 205 may be connected to at least one of the plurality of circuit elements 220a, 220b, and 220c disposed in the peripheral circuit region PERI through a first input-output contact plug 203, and may be separated from the first substrate 210 by the lower insulating film 201. In addition, a side insulating film may be disposed between the first input-output contact plug 203 and the first substrate 210 to electrically separate the first input-output contact plug 203 and the first substrate 210.

Referring to FIG. 17, an upper insulating film 301 covering the upper surface of the second substrate 310 may be formed on the second substrate 310, and a second input-output pad 305 may be disposed on the upper insulating layer 301. The second input-output pad 305 may be connected to at least one of the plurality of circuit elements 220a, 220b, and 220c disposed in the peripheral circuit region PERI through a second input-output contact plug 303.

In some embodiments, the second substrate 310 and the common source line 320 may not be disposed in an area in which the second input-output contact plug 303 is disposed. Also, the second input-output pad 305 may not overlap the word lines 330 in the third direction (the Z-axis direction). Referring to FIG. 17, the second input-output contact plug 303 may be separated from the second substrate 310 in a direction, parallel to the upper surface of the second substrate 310, and may pass through the interlayer insulating layer 315 of the cell region CELL to be connected to the second input-output pad 305.

In some embodiments, the first input-output pad 205 and the second input-output pad 305 may be selectively formed. For example, the memory device 400 may include only the first input-output pad 205 disposed on the first substrate 210 or the second input-output pad 305 disposed on the second substrate 310. Alternatively, the memory device 400 may include both the first input-output pad 205 and the second input-output pad 305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 400 may include a lower metal pattern 273a, corresponding to an upper metal pattern 372a formed in an uppermost metal layer of the cell region CELL, and having the same shape as the upper metal pattern 372a of the cell region CELL, in an uppermost metal layer of the peripheral circuit region PERI. In the peripheral circuit region PERI, the lower metal pattern 273a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 271b and 272b may be formed on the second metal layer 240b in the word line bonding area WLBA. In the word line bonding area WLBA, the lower bonding metals 271b and 272b of the peripheral circuit region PERI may be electrically connected to the upper bonding metals 371b and 372b of the cell region CELL by a Cu—Cu bonding.

Further, the bit line bonding area BLBA, an upper metal pattern 392, corresponding to a lower metal pattern 252 formed in the uppermost metal layer of the peripheral circuit region PERI, and having the same shape as the lower metal pattern 252 of the peripheral circuit region PERI, may be formed in an uppermost metal layer of the cell region CELL. A contact may not be formed on the upper metal pattern 392 formed in the uppermost metal layer of the cell region CELL.

In some embodiments, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

While the inventive concept has been particularly shown and described with reference to embodiments thereof, it will be understood that various changes in form and details may be made therein without departing from the spirit and scope of the following claims.

What is claimed is:

1. An operating method for a non-volatile memory device, the method comprising:
performing a read operation on adjacent memory cells connected to an adjacent word line proximate to a target word line to determine adjacent data;
classifying target memory cells connected to the target word line into groups according to the adjacent data;
counting a number of memory cells of a first group, among the groups, corresponding to a number of peripheral voltage levels around a preset read voltage level;
setting one of the peripheral voltage levels as a first read voltage level for the first group based on the counted number of memory cells;
setting a read voltage level for each of the groups other than the first group based on the first read voltage level for the target memory cells; and
performing a read operation on the target memory cells using the read voltage level set for each of the groups.

2. The method of claim 1, wherein the classifying of the target memory cells into groups comprises:
classifying the adjacent memory cells into groups based on the adjacent data; and
classifying the target memory cells into groups corresponding to a group to which respective adjacent memory cells belong.

3. The method of claim 1, wherein the classifying of the target memory cells into groups comprises:
storing the adjacent data read from adjacent memory cells connected to at least one bit line; and determining to which group, among the groups, a target memory cell sharing a bit line with an adjacent memory cell belongs based on the adjacent data.

4. The method of claim 1, wherein the classifying of the target memory cells into groups comprises matching a logical high state ("high") or a logical low state ("low") of adjacent data read from an adjacent memory cell with data stored in a target memory cell.

5. The method of claim 4, wherein the classifying of the target memory cells into the groups comprises classifying the adjacent data of each of the adjacent memory cells into a high or a low according to a threshold voltage distribution of the adjacent memory cells.

6. The method of claim 4, wherein the classifying of the target memory cells into groups comprises when a program state of the adjacent memory cell is high, multiplying a value of the program state of the adjacent memory cell by the program state of the target memory cell.

7. The method of claim 6, wherein the classifying of the target memory cells into the groups comprises when the program state of the adjacent memory cell is low, multiplying an inverted value of the program state of the adjacent memory cell by the program state of the target memory cell.

8. The method of claim 1, wherein the one peripheral voltage level has a minimum counted number of memory cells among the peripheral voltage levels.

9. The method of claim 1, wherein the setting of the read voltage level for each group other than the first group comprises setting a second read voltage level of a second group based on a preset offset value for memory cells belonging to the second group different from the first group.

10. The method of claim 1, wherein:
the non-volatile memory device comprises a memory cell array, and
the method further comprises setting the read voltage level for the target word line as a read voltage level for a plurality of word lines of the memory cell array.

11. The method of claim 1, wherein:
the non-volatile memory device comprises a memory cell array,
the memory cell array includes word line groups, and
the method further comprises setting the read voltage level for the target word line as the read voltage level for a word line group including the target word line.

12. The method of claim 1, further comprising:
determining whether errors in data read from the target memory cells are correctable using an error checking and correction (ECC) operation; and
performing the read operation on the adjacent memory cells upon determining that the errors are uncorrectable.

13. A non-volatile memory device comprising:
a memory cell array including memory cells respectively connected to bit lines and word lines; and
control logic configured to:
perform a read operation on the memory cells connected to a target word line among the word lines and an adjacent word line proximate to the target word line,
classify target memory cells connected to the target word line into a plurality of groups according to adjacent data read from adjacent memory cells connected to the adjacent word line,
count a number of memory cells corresponding to a number of peripheral voltage levels around a preset read voltage level among a first group among the plurality of groups,
set one of the peripheral voltage levels to a first read voltage level for the first group based on the counted number of memory cells,
set a read voltage level for each of the groups based on the first read voltage level, and
perform a read operation on the target memory cells using the read voltage level set for each of the groups.

14. The non-volatile memory device of claim 13, wherein:
the control logic classifies the adjacent memory cells into a group among the plurality of groups according to the adjacent data, and
classifies the target memory cells into at least one of the plurality of groups in response to the group to which the adjacent memory cells belong.

15. The non-volatile memory device of claim 13, wherein the control logic stores the adjacent data for each bit line and determines to which group, among the plurality of groups, a target memory cell sharing the bit line with an adjacent memory cell belongs according to the read result of the adjacent memory cell.

16. The non-volatile memory device of claim 15, wherein the control logic classifies the target memory cells into the plurality of groups by comparing a program state of the adjacent memory cell that is reset to logic high state ("high") or a logical low state ("low") with a program state of the target memory cell.

17. The non-volatile memory device of claim 13, wherein the control logic is further configured to set a read voltage level for the target word line as a read voltage level for at least another one of the word lines.

18. A non-volatile memory system comprising:
a memory cell array including memory cells respectively connected to bit lines and word lines; and
control logic configured to:
perform a read operation directed to target memory cells connected to a target word line among the word lines,
perform a read operation directed to adjacent memory cells storing adjacent data and connected to an adjacent word line proximate the target word line,
classify target memory cells into a group among a plurality of groups based on the adjacent data,
count a number of memory cells corresponding to a number of peripheral voltage levels around a preset read voltage level among a first group among the plurality of groups,
set one of the peripheral voltage levels to a first read voltage level for the first group based on the counted number of memory cells,
set a read voltage level for each of the groups based on the first read voltage level, and
perform a read operation on the target memory cells using the read voltage level set for each of the groups.

* * * * *